United States Patent
Huang et al.

(10) Patent No.: US 12,453,276 B2
(45) Date of Patent: Oct. 21, 2025

(54) DISPLAY PANEL

(71) Applicants: Chengdu BOE Optoelectronics Technology Co., Ltd., Sichuan (CN); BOE Technology Group Co., Ltd., Beijing (CN)

(72) Inventors: Weiyun Huang, Beijing (CN); Yudiao Cheng, Beijing (CN); Pinchao Gu, Beijing (CN)

(73) Assignees: CHENGDU OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 106 days.

(21) Appl. No.: 18/194,427

(22) Filed: Mar. 31, 2023

(65) Prior Publication Data

US 2023/0309337 A1    Sep. 28, 2023

Related U.S. Application Data

(63) Continuation of application No. 17/271,248, filed as application No. PCT/CN2020/093514 on May 29, 2020, now Pat. No. 11,871,605.

(51) Int. Cl.
*H10K 50/844* (2023.01)
*H10K 59/122* (2023.01)
(Continued)

(52) U.S. Cl.
CPC ......... *H10K 50/844* (2023.02); *H10K 59/122* (2023.02); *H10K 71/00* (2023.02); *H10K 59/1201* (2023.02); *H10K 2102/351* (2023.02)

(58) Field of Classification Search
CPC .... H10K 50/844; H10K 50/84; H10K 50/841; H10K 59/122; H10K 59/1201;
(Continued)

(56) References Cited

U.S. PATENT DOCUMENTS

| 10,199,448 B2 | 2/2019 | Kim et al. |
| 10,205,122 B2 | 2/2019 | Choi et al. |

(Continued)

FOREIGN PATENT DOCUMENTS

| CN | 106887523 A | 6/2017 |
| CN | 206282861 U | 6/2017 |

(Continued)

OTHER PUBLICATIONS

English Translation of International Search Report from PCT/CN2020/093514 dated Feb. 20, 2021 (3 pages).
(Continued)

*Primary Examiner* — Nikolay K Yushin
(74) *Attorney, Agent, or Firm* — Calfee, Halter & Griswold LLP

(57) ABSTRACT

This disclosure relates to a display panel and a manufacturing method thereof, and a display device. The display panel includes a display area, an opening area and an isolation area located between the display area and the opening area and surrounding the opening area, and includes: a base substrate; a driving circuit layer including a thin film transistor and a storage capacitor that are formed on the base substrate and located in the display area, the thin film transistor including a gate electrode, a first gate insulating layer, an interlayer dielectric layer and source and drain electrodes that are sequentially formed, the storage capacitor including a first electrode plate on the same layer as the gate electrode, and a second electrode plate; a first isolation column formed on the base substrate and located in the isolation area.

20 Claims, 7 Drawing Sheets

(51) Int. Cl.
*H10K 71/00* (2023.01)
*H10K 59/12* (2023.01)
*H10K 102/00* (2023.01)

(58) Field of Classification Search
CPC .. H10K 59/12; H10K 59/1213; H10K 59/121; H10K 59/124; H10K 59/1216; H10K 71/00; H10K 71/135; H10K 2102/351; H10K 59/873; H10K 59/80; H10K 59/131; H10K 2102/00; H10K 2102/311
See application file for complete search history.

(56) References Cited

U.S. PATENT DOCUMENTS

| | | | |
|---|---|---|---|
| 10,276,837 | B2 | 4/2019 | Narutaki et al. |
| 10,461,284 | B2 | 10/2019 | Narutaki et al. |
| 10,497,900 | B2 | 12/2019 | Choi et al. |
| 10,535,725 | B2 | 1/2020 | Kim et al. |
| 10,608,062 | B2 | 3/2020 | Takahashi et al. |
| 10,868,102 | B1 | 12/2020 | Zhang et al. |
| 2017/0148856 | A1 | 5/2017 | Choi et al. |
| 2017/0373129 | A1 | 12/2017 | Kim et al. |
| 2018/0102502 | A1 | 4/2018 | Kim |
| 2019/0019993 | A1 | 1/2019 | Narutaki et al. |
| 2019/0157373 | A1 | 5/2019 | Kim et al. |
| 2019/0157614 | A1 | 5/2019 | Choi et al. |
| 2019/0280249 | A1 | 9/2019 | Narutaki et al. |
| 2019/0334120 | A1 | 10/2019 | Seo et al. |
| 2019/0363146 | A1 | 11/2019 | Takahashi et al. |
| 2020/0136068 | A1 | 4/2020 | Lee et al. |
| 2020/0168683 | A1 | 5/2020 | Son et al. |

FOREIGN PATENT DOCUMENTS

| | | | |
|---|---|---|---|
| CN | 107104077 | A | 8/2017 |
| CN | 107546245 | A | 1/2018 |
| CN | 109429571 | A | 3/2019 |
| CN | 107104077 | B | 4/2019 |
| CN | 109920818 | A | 6/2019 |
| CN | 110164945 | A | 8/2019 |
| CN | 110265583 | A | 9/2019 |
| CN | 110323252 | A | 10/2019 |
| CN | 110416435 | A | 11/2019 |
| CN | 110429199 | A | 11/2019 |
| CN | 110491913 | A | 11/2019 |
| CN | 110649177 | A | 1/2020 |
| CN | 111129078 | A | 5/2020 |
| CN | 111211145 | A | 5/2020 |
| CN | 210535696 | U | 5/2020 |
| EP | 3565004 | A1 | 11/2019 |
| JP | 2020061354 | A | 4/2020 |
| KR | 1020180047281 | A | 5/2018 |
| KR | 102019018120 | A | 2/2019 |
| KR | 20190023855 | A | 3/2019 |
| KR | 1020200015865 | A | 2/2020 |
| KR | 1020200060002 | A | 5/2020 |
| WO | 2018167926 | A1 | 9/2018 |
| WO | 2018188152 | A1 | 10/2018 |
| WO | 2020098204 | A1 | 5/2020 |
| WO | 2021227027 | A1 | 11/2021 |

OTHER PUBLICATIONS

First Office Action of Japanese Patent Application No. 2021-564336 dated Apr. 1, 2024.
Notice of Allowance of KR application No. 10-2021-7035250 dated Oct. 11, 2024.

DISPLAY PANEL

CROSS-REFERENCE TO RELATED APPLICATIONS

This application is a continuation of U.S. application Ser. No. 17/271,248, filed on Feb. 25, 2021, which is based on, and claims the benefit of, and claims priority to International Application No. PCT/CN2020/093514, filed on May 29, 2020, and the entire contents thereof are incorporated herein by reference.

TECHNICAL FIELD

The present disclosure relates to the technical field of display, in particular, to a display panel and a manufacturing method thereof, and a display device.

BACKGROUND

With rapid development of mobile display technology in recent years, a new generation of display technology represented by active-matrix organic light-emitting diode (AMOLED) is being widely used. AMOLED is thinner and lighter, can actively emit light (i.e., no backlight is required), has no viewing angle problems, high definition, high brightness, fast response, low energy consumption, wide operating temperature range, strong shock resistance, soft display, and the like.

Also, the market demand for display panels with high screen ratio is increasingly urgent, and the existing designs such as "screen with rectangular notch or drop-shaped notch" have not met user's requirements. In this case, the technology for punching the screen emerges as a new design.

The light-emitting materials used in the flexible AMOLED technology are organic light-emitting materials which are very sensitive to moisture and oxygen, and cannot be exposed to the environment with moisture and oxygen. Otherwise, corrosion will easily occur, resulting in failure of organic light-emitting materials and abnormal display. Therefore, it is necessary to be isolated from moisture and oxygen.

SUMMARY

A first aspect of the present disclosure provides a display panel, which includes a display area, an opening area and an isolation area between the display area and the opening area. The isolation area is at least partially arranged around the opening area. The display panel includes:
  a base substrate;
  a driving circuit layer including a thin film transistor and a storage capacitor formed on the base substrate and located in the display area, wherein the thin film transistor includes a gate electrode, a first gate insulating layer formed at a side of the gate electrode away from the base substrate, an interlayer dielectric layer formed at a side of the first gate insulating layer away from the base substrate, and source and drain electrodes formed at a side of the interlayer dielectric layer away from the base substrate; the storage capacitor includes a first electrode plate arranged on the same layer as the gate electrode, and a second electrode plate;
  a first isolation column formed on the base substrate and located in the isolation area; in which the first isolation column is arranged around the opening area and includes a first metal layer, a first insulating layer formed at a side of the first metal layer away from the base substrate, a second insulating layer formed at a side of the first insulating layer away from the base substrate, and a second metal layer formed at a side of the second insulating layer away from the base substrate;
  the second insulating layer includes a first portion, a second portion and a first inclined portion connecting the first portion and the second portion, wherein an orthographic projection of the first inclined portion on the base substrate at least partially overlaps with an orthographic projection of the first metal layer on the base substrate, and an orthographic projection of the second portion on the base substrate is within the orthographic projection of the first metal layer on the base substrate;
  the second metal layer is located at a side of the second portion away from the base substrate.

A second aspect of the present disclosure provides a display device including the display panel as mentioned above.

The second aspect of the present disclosure provides a manufacturing method of a display panel. The display panel includes a display area, an opening area and an isolation area between the display area and the opening area, the isolation area at least partially surrounds the opening area. The manufacturing method includes the following steps:
  providing a base substrate;
  forming a driving circuit layer and a first isolation column on the base substrate; in which
  the driving circuit layer includes a thin film transistor and a storage capacitor in the display area, the thin film transistor includes a gate electrode, a first gate insulating layer formed at a side of the gate electrode away from the base substrate, an interlayer dielectric layer formed at a side of the first gate insulating layer away from the base substrate, and source and drain electrodes formed at a side of the interlayer dielectric layer away from the base substrate; the storage capacitor includes a first electrode plate arranged on the same layer as the gate electrode and a second electrode plate positioned between the first gate insulating layer and the interlayer dielectric layer;
  the first isolation column is arranged around the opening area and includes a first metal layer, a first insulating layer formed at a side of the first metal layer away from the base substrate, a second insulating layer formed at a side of the first insulating layer away from the base substrate, and a second metal layer formed at a side of the second insulating layer away from the base substrate; the first metal layer is arranged on the same layer as the first electrode plate or the second electrode plate; the first insulating layer is arranged on the same layer as the first gate insulating layer; the second insulating layer is arranged on the same layer as the interlayer dielectric layer, and includes a first portion, a second portion and a first inclined portion connecting the first portion and the second portion, a slope angle of the first inclined portion is less than 90°; the second metal layer is arranged on the same layer as the source and drain electrodes and is located at a side of the second portion away from the base substrate, and a notch surrounding the opening area is arranged at a side facing towards the display area and/or at a side facing towards the opening area.

In an exemplary embodiment of the present disclosure,
the first metal layer is arranged on the same layer as the first electrode plate;
the first isolation column further includes a third metal layer, and the third metal layer is arranged on the same layer as the second electrode plate.

In an exemplary embodiment of the present disclosure, the method further includes:
forming a second isolation column, that is located in the isolation area, on the base substrate; in which the second isolation column is arranged around the opening area, and at least includes a fourth metal layer that has the same structure with the second metal layer and is arranged on the same layer as the second metal layer;
forming a planarization layer covering the thin film transistor in the display area;
forming a pixel defining layer on the planarization layer in the display area for defining a plurality of pixel units;
forming a first barrier dam and a second barrier dam in the isolation area, in which the first barrier dam is arranged around the opening area, and the first barrier dam is arranged on the same layer as the pixel defining layer; the second barrier dam is arranged around the opening area and at a side of the first barrier dam close to the opening area, and the second barrier dam is arranged on the same layer as the planarization layer and the pixel defining layer; and a height of the second barrier dam is greater than that of the first barrier dam;
the first barrier dam and the second barrier dam are positioned between the first isolation column and the second isolation column.

In an exemplary embodiment of the present disclosure, a structure of the second isolation column is the same as that of the first isolation column.

BRIEF DESCRIPTION OF THE DRAWINGS

The accompanying drawings are used to provide a further understanding of the embodiments of the present disclosure, and constitute a part of the specification, and are used to explain the present disclosure together with the embodiments of the present disclosure, and do not constitute a limitation to the present disclosure. The above and other features and advantages will become more apparent to those skilled in the art by describing the detailed example embodiments with reference to the accompanying drawings. In the drawings.

Figure 1:
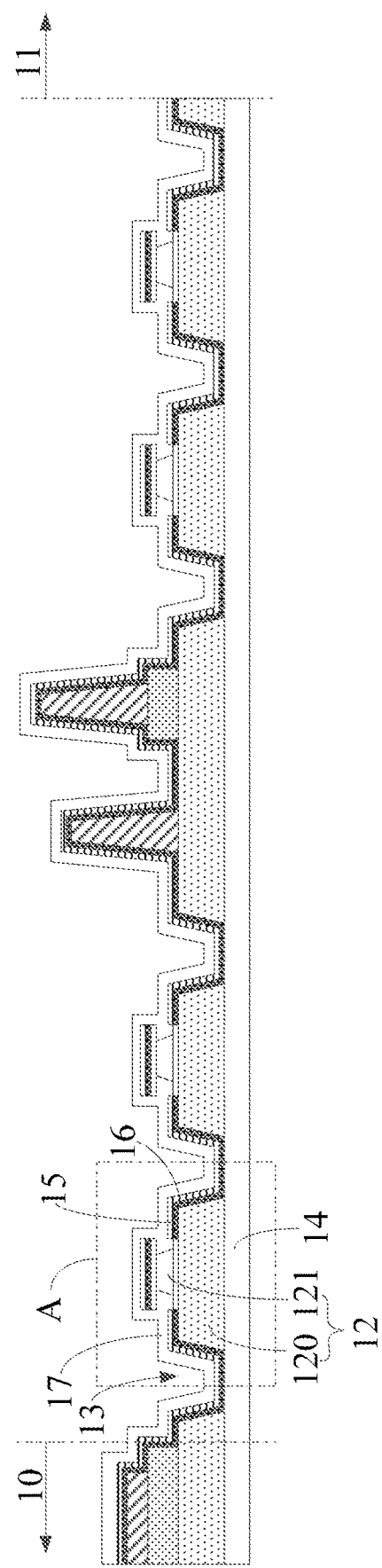
FIG. 1 is a structural schematic view of a part between a display area and an isolation area in a display panel according to an embodiment of the present disclosure.

Reference numbers are indicated as follows:
10: display area; 11: opening area; 12: isolation column; 120: ILD+GI+buffer layer; 121: SD metal layer; 13: isolation groove; 14: base substrate; 15: organic light-emitting material; 16: cathode layer; 17: inorganic packaging layer;
2: display panel; 20a: display area; 20b: opening area; 20c: isolation area; 21: base substrate; 22: buffer layer; 23: first isolation column; 230: first metal layer; 231: first insulating layer; 232: second insulating layer; 232a: first portion; 232b: second portion; 232c: first inclined portion; 233: second metal layer; 233a: notch; 234: third insulating layer; 235: fourth insulating layer; 236: third metal layer; 24: thin film transistor; 240: semiconductor layer; 241: second gate insulating layer; 242: gate electrode; 243: first gate insulating layer; 244: interlayer dielectric layer; 245: source electrode; 246: drain electrode; 25: storage capacitor; 250: first electrode plate; 251: second electrode plate; 26: planarization layer; 27: pixel defining layer; 28: first barrier dam; 29: second barrier dam; 290: first barrier portion; 291: second barrier portion; 30: pixel unit; 300: anode; 301: organic light-emitting material; 302: cathode; 31: second isolation column; 310: fourth metal layer; 311: fifth metal layer; 312: fifth insulating layer; 313: sixth insulating layer; 313a: third portion; 313b: fourth portion; 313c: second inclined portion; 314: seventh insulating layer; 315: eighth insulating layer; 316: sixth metal layer; 32: packaging thin film; 320: first inorganic packaging layer; 321: organic packaging layer; 322: second inorganic packaging layer.

DETAILED DESCRIPTION

Hereinafter, the technical solutions of the present disclosure will be further specifically described with reference to embodiments and in conjunction with the accompanying drawings. In the specification, the same or similar reference numbers indicate the same or similar components. The description of the embodiments of the present disclosure with reference to the drawings is intended to explain a generic concept of the present disclosure, and should not be construed as limiting the present disclosure.

In addition, for convenience of explanation, many specific details below are set forth to provide a comprehensive understanding of the embodiments of the present disclosure. However, it should be appreciated that one or more embodiments could also be implemented without providing those specific details thereof.

It should be explained that "on", "formed on" and "disposed on" herein may be referred to that one layer is directly formed or disposed on another layer, or that one layer is indirectly formed or disposed on another layer, that is, there are other layers between these two layers.

Words such as "one", "an/a", "the" and "said" are used herein to indicate the presence of one or more elements/component parts/and others. Terms "include", "comprise" and "have" are intended to be inclusive, and mean there may be additional elements/constituents/or the like other than the listed elements/constituents/or the like.

It should be noted that although the terms "first", "second" or the like may be used herein to describe various components, members, elements, regions, layers and/or parts, these components, members, elements, regions, and layers and/or parts should not be limited by these terms. Rather, these terms are used to distinguish one component, member, element, region, layer, and/or part from another.

In the present disclosure, unless otherwise specified, the term "arrange on the same layer" used means that two layers, components, members, elements or parts can be formed by the same patterning process, and these two layers, components, members, elements or parts are generally formed of the same material, and are located on the same film layer and are in direct contact with the film layer.

In the present disclosure, unless otherwise specified, the expression "patterning process" generally includes steps of photoresist coating, exposure, development, etching, photoresist stripping, and the like. The expression "one-step/same patterning process" means a process of using one/same mask plate to form patterned layers, components, members, etc.

The present disclosure provides a display panel and a manufacturing method thereof, and a display device, which can prevent water vapor and oxygen from entering a display area through an opening of an opening area, thereby prolonging service life and display effect of products.

Figure 2:
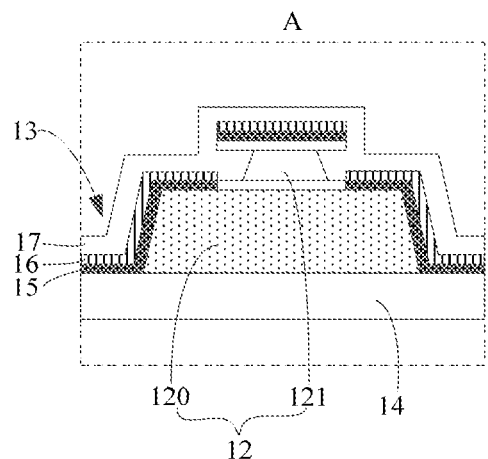
FIG. 2 is an enlarged structural schematic view of the part A shown in FIG. 1.
Figure 3:
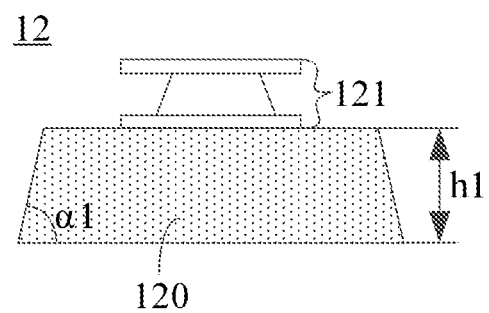
FIG. 3 is a structural schematic view of an isolation column shown in FIG. 2.

In an embodiment of the present disclosure, as shown in FIG. 1, an isolation column 12, an isolation groove 13 and other structures are arranged between the display area 10 and the opening area 11 to block the organic light-emitting material 15, thereby playing a role in isolating a passage for moisture and oxygen, and also blocking the cathode layer 16. The manufacturing method of the isolation column 12 is: depositing a buffer layer, a gate insulating layer ("Gate Insulator", also referred to as GI) and an interlayer dielectric layer (ILD) on the substrate 14 respectively; obtaining a specific pattern by exposing, developing, EBA (Etch Bending A)/EBB (Etch Bending B) etching the ILD+GI+buffer layer (i.e., ILD layer+GI layer+buffer layer) 120; forming an SD (source and drain) metal layer 121 on the specific pattern; and etching the SD metal layer 121 to form an undercut structure, for blocking the organic light-emitting material 15. Specifically, as shown in FIGS. 2 to 3, the isolation column 12 made by EBA/EBB etching may be referred to as EBA/EBB isolation column. This EBA/EBB isolation column can share a mask with the bending process.

In addition, as shown in FIG. 3, the EBA/EBB isolation column has two characteristics: 1. the formed slope angle α1 is large; and 2. the formed segment difference (i.e., level difference) h1 is large. In this way, the inorganic packaging layer 17 formed by chemical vapor deposition (CVD) technology is deposited very steeply on the slope of ILD+GI+buffer layer 120, which is bad for releasing external stress and may easily generate cracks under the action of the external stress, leading to packaging failure, so that moisture and oxygen may intrude the device to cause abnormal display.

Figure 4:
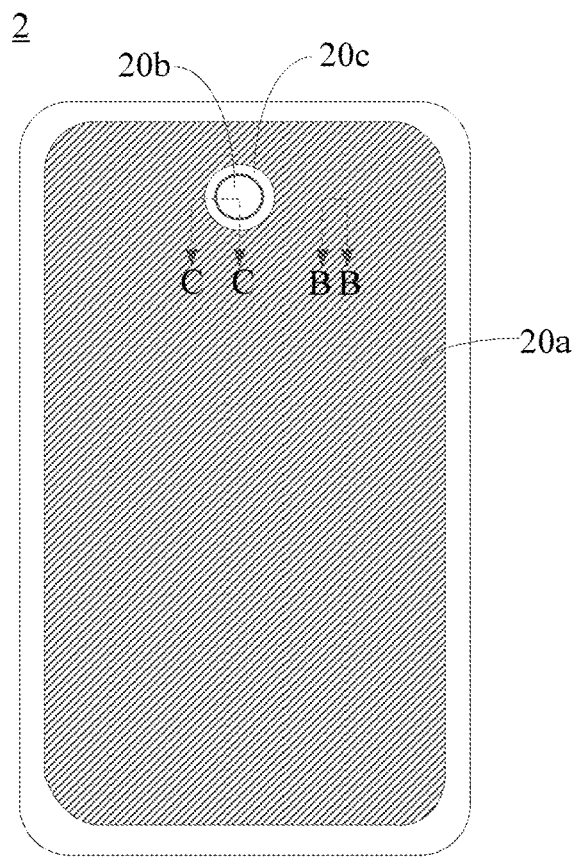
FIG. 4 is a schematic structural view of a display panel described in another embodiment of the present disclosure.

In order to solve the above problem, as shown in FIG. 4, an embodiment of the present disclosure provides a display panel 2, which may be an OLED display. The display panel 2 may include a display area 20a, an opening area 20b, and an isolation area 20c between the display area 20a and the opening area 20b. The isolation area 20c is at least partially arranged around the opening area 20b.

Next, the display panel 2 according to the embodiment of the present disclosure will be described in detail with reference to the accompanying drawings.

As shown in FIGS. 4 to 11, the display panel 2 may include a base substrate 21, a driving circuit layer and a first isolation column 23.

When the display panel 2 is a flexible panel, the provided base substrate 21 may be a flexible base substrate such as polyimide (PI), and when the display panel 2 is a rigid base substrate, the base substrate 21 may be a rigid base substrate such as glass or quartz.

It should be noted that in order to facilitate manufacturing the required components in each area of the display panel 2 in the subsequent processing, areas may be defined on the base substrate 21, for example, the base substrate 21 may be divided into the display area 20a, the isolation area 20c and the opening area 20b.

Figure 5:
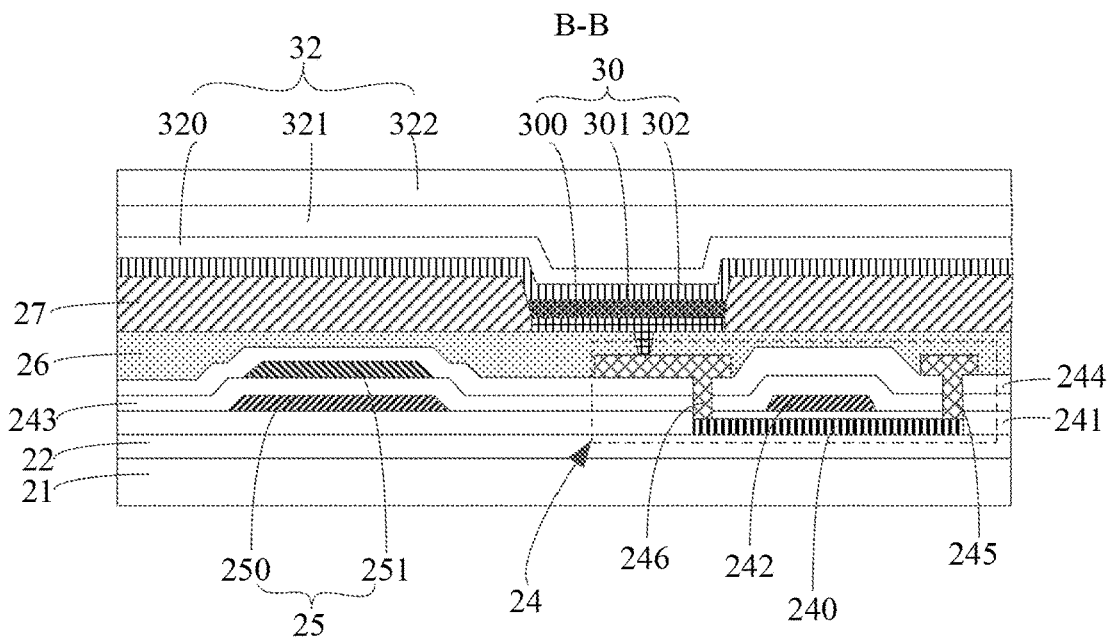
FIG. 5 is a schematic cross-sectional view of the display panel taken along a line B-B in one embodiment shown in FIG. 4.

As shown in FIG. 5, a driving circuit layer is formed on the base substrate 21. The driving circuit layer may include a thin film transistor 24 and a storage capacitor 25 formed on the base substrate 21 and located in the display area 20a.

For detailed description, as shown in FIG. 5, the thin film transistor 24 may include a gate electrode 242, a first gate insulating layer 243, an interlayer dielectric layer 244, and source and drain electrodes that are sequentially formed. That is, the gate electrode 242 may be formed on the base substrate 21. Then, the first gate insulating layer 243 is formed at a side of the gate electrode 242 away from the base substrate 21, the interlayer dielectric layer is formed at a side of the first gate insulating layer 243 away from the base substrate 21, and the source and drain electrodes are formed at a side of the interlayer dielectric layer 244 away from the base substrate 21. Furthermore, the thin film transistor 24 may further include a semiconductor layer 240 which may be located at a side of the gate electrode 242 close to the base substrate 21 so that the thin film transistor 24 is of a top gate type. It should be understood that when the thin film transistor 24 is of a top gate type, the thin film transistor 24 may further include a second gate insulating layer 241 located between the gate electrode 242 and the semiconductor layer 240.

However, it is not limited thereto. The semiconductor layer 240 may also be located at a side of the gate electrode 242 away from the base substrate 21 and located between the first gate insulating layer 243 and the interlayer dielectric layer 244, so that the thin film transistor 24 is of a bottom gate type. It should be understood that the thin film transistor 24 according to the embodiment of the present disclosure is not limited to the top gate type shown in the figure, and may also be of a bottom gate type.

It should be noted that as shown in FIG. 5, the aforementioned source and drain electrodes include a source electrode 245 and a drain electrode 246 arranged on the same layer, and the source electrode 245 and the drain electrode 246 may be respectively connected with both ends of the semiconductor layer 240 through via holes on the interlayer dielectric layer 244 and the first gate insulating layer 243.

As shown in FIG. 5, the storage capacitor 25 includes a first electrode plate 250 and a second electrode plate 251. The first electrode plate 250 is arranged on the same layer as the gate electrode 242, and the second electrode plate 251 is located between the first gate insulating layer 243 and the interlayer dielectric layer 244.

For example, the first gate insulating layer 243, the second gate insulating layer 241 and the interlayer dielectric layer 244 mentioned in the embodiment of the present disclosure may be made of inorganic insulating materials, such as silicon oxide and silicon nitride. The semiconductor layer 240 may be made of polysilicon, metal oxide and other materials. The gate electrode 242, the first electrode plate 250 and the second electrode plate 251 may be made of metal or alloy materials such as aluminum, titanium and cobalt. The source electrode 245 and the drain electrode 246 may be made of metal materials or alloy materials, for example, a metal single-layer or multi-layer structure formed of molybdenum, aluminum, titanium, or the like. When the source electrode 245 and the drain electrode 246 have a multi-layer structure, the multi-layer structure may be a multi-metal layer lamination (i.e., multi-metal layer stack), such as Ti/Al/Ti metal lamination.

As shown in FIG. 5, a buffer layer 22 may also be arranged between the base substrate 21 and the driving circuit layer. The buffer layer 22 may be made of silicon nitride, silicon oxide and other materials, which can achieve effects of blocking moisture and oxygen and blocking alkaline ions, and can also protect other structures on the base substrate 21. It should be noted that not only the buffer layer 22 but also other layers may be provided between the base substrate 21 and the driving circuit layer, which can be determined depending on the specific situations. When the thin film transistor 24 is of a top gate type, the semiconductor layer 240 may be located on the buffer layer 22.

As shown in FIGS. 6 to 11, the first isolation column 23 is formed on the base substrate 21 and located in the isolation area 20c. The first isolation column 23 is arranged around the opening area 20b, and includes a first metal layer 230, a first insulating layer 231, a second insulating layer 232 and a second metal layer 233 formed in sequence, that is, firstly the first metal layer 230 may be formed on the base substrate 21, and then, the first insulating layer 231 is formed at a side of the first metal layer 230 away from the base substrate 21, the second insulating layer 232 is formed at a side of the first insulating layer 231 away from the base substrate 21, and the second metal layer 233 is formed at a side of the second insulating layer 232 away from the base substrate 21.

Figure 6:
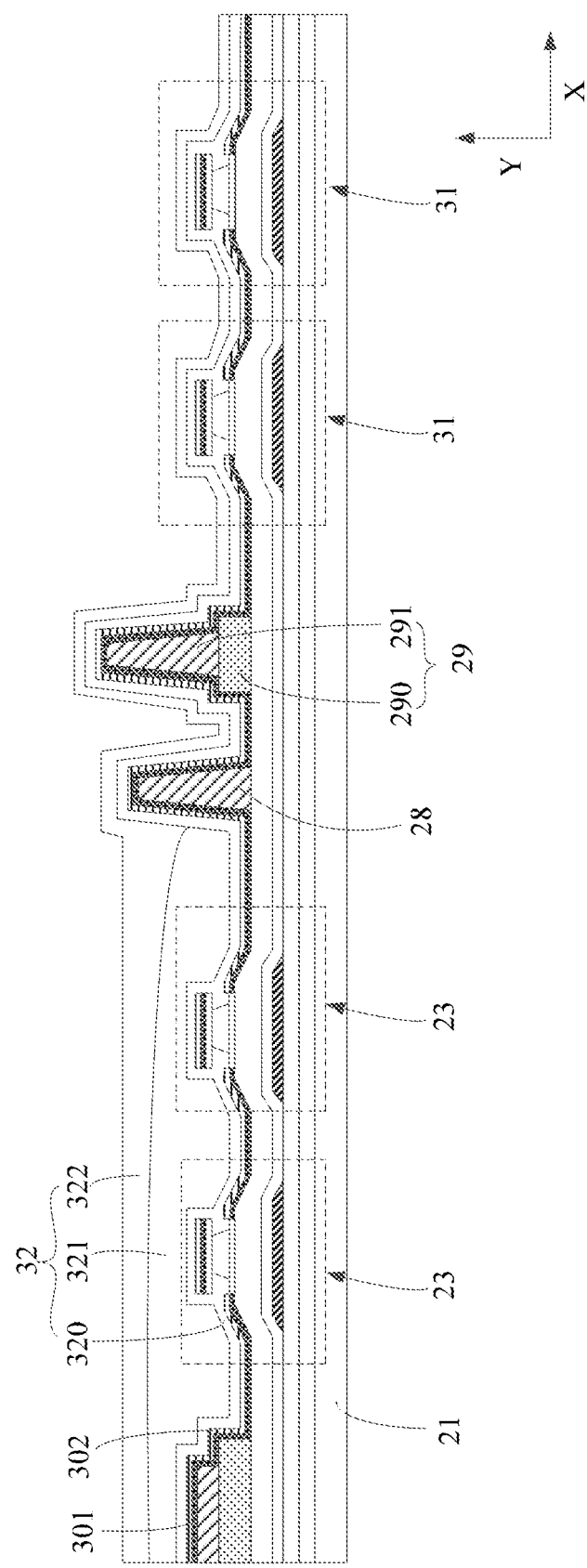
FIG. 6 is a schematic cross-sectional view of the display panel taken along a line C-C in one embodiment shown in FIG. 4.
Figure 7:
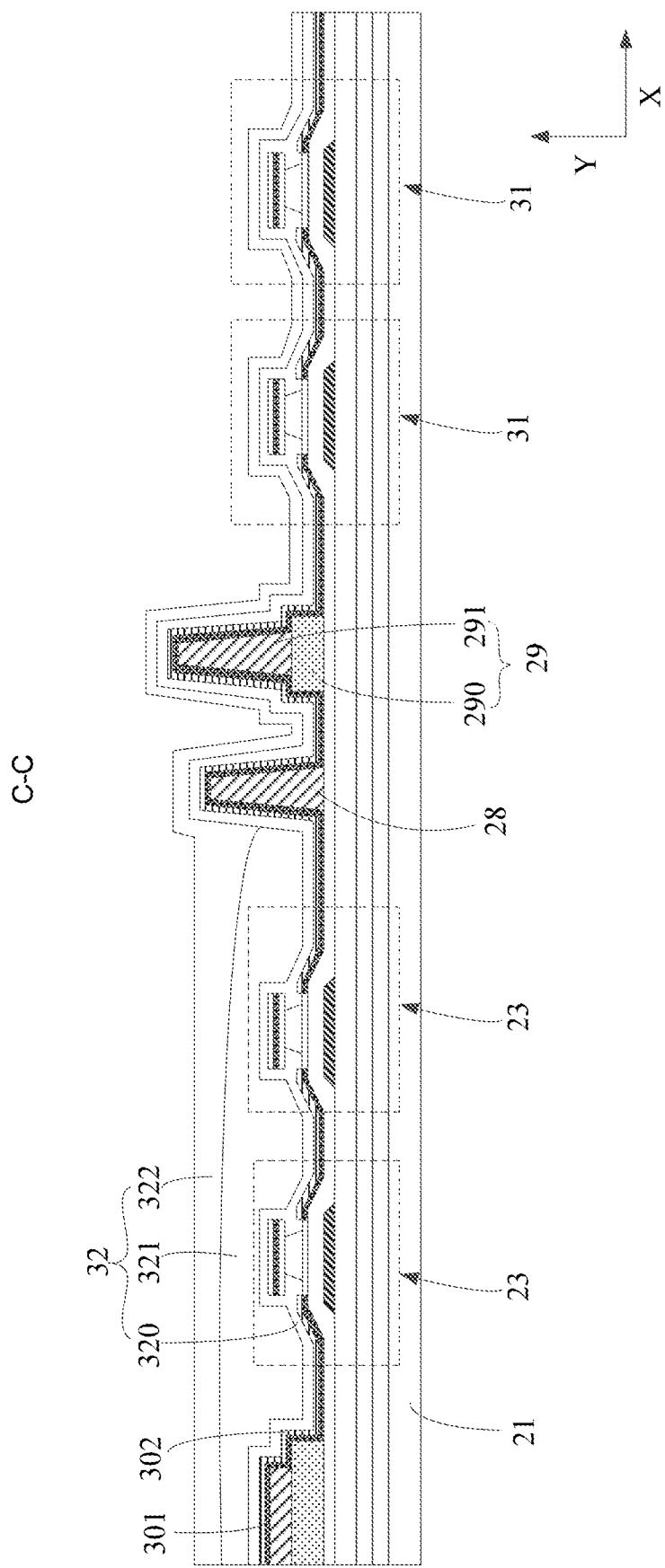
FIG. 7 is a schematic cross-sectional view of the display panel taken along a line C-C in another embodiment shown in FIG. 4.
Figure 8:
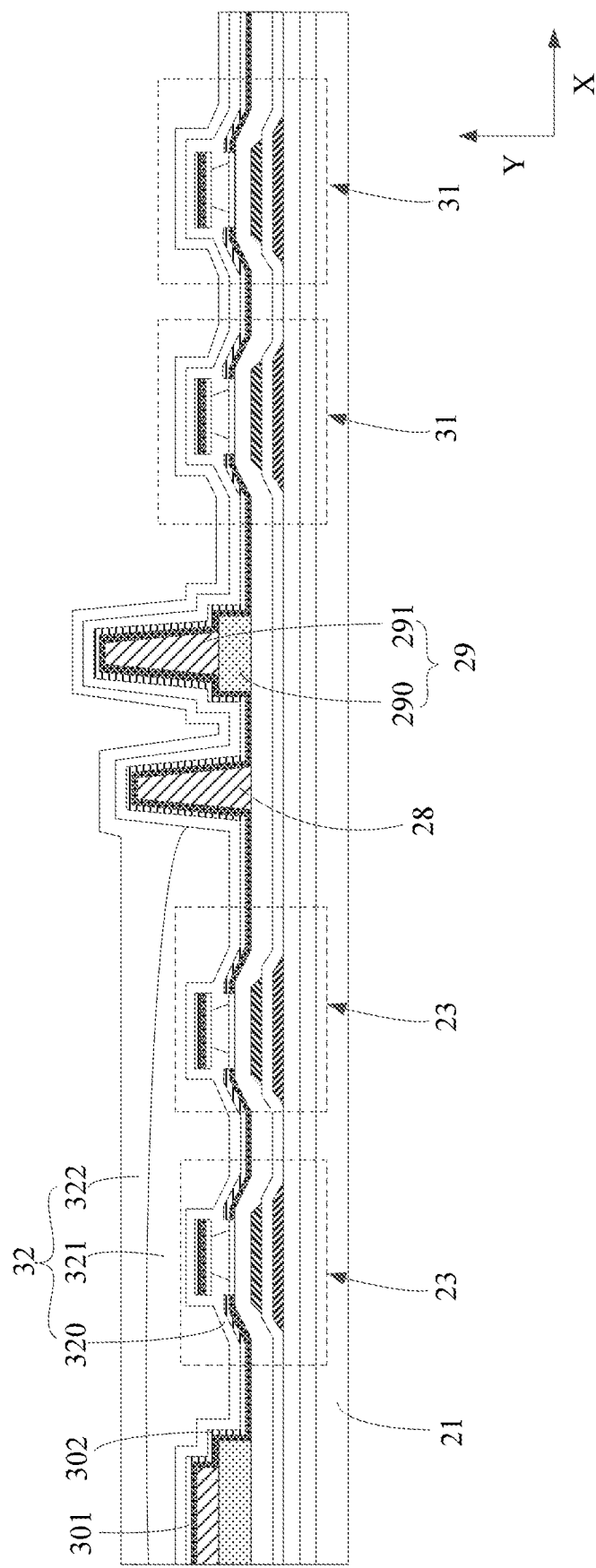
FIG. 8 is a schematic cross-sectional view of the display panel taken along a line C-C in yet another embodiment shown in FIG. 4.
Figure 9:
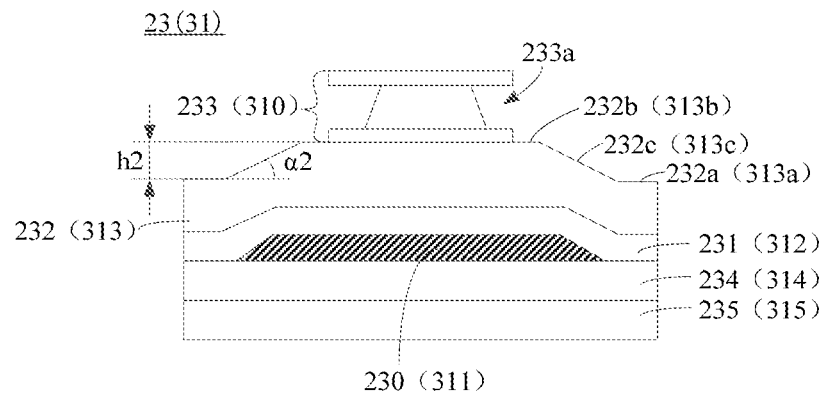
FIG. 9 is a schematic structural view of the first isolation column or the second isolation column of the display area in the display panel shown in FIG. 6.
Figure 10:
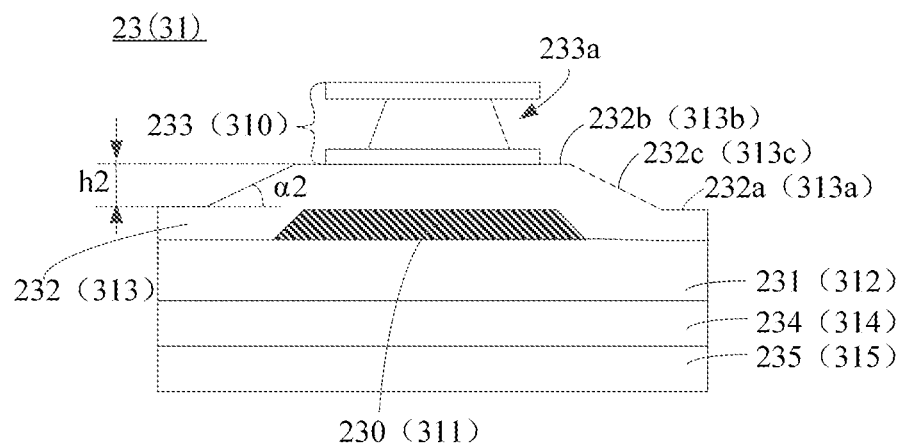
FIG. 10 is a structural schematic view of the first isolation column or the second isolation column of the display area in the display panel shown in FIG. 7.
Figure 11:
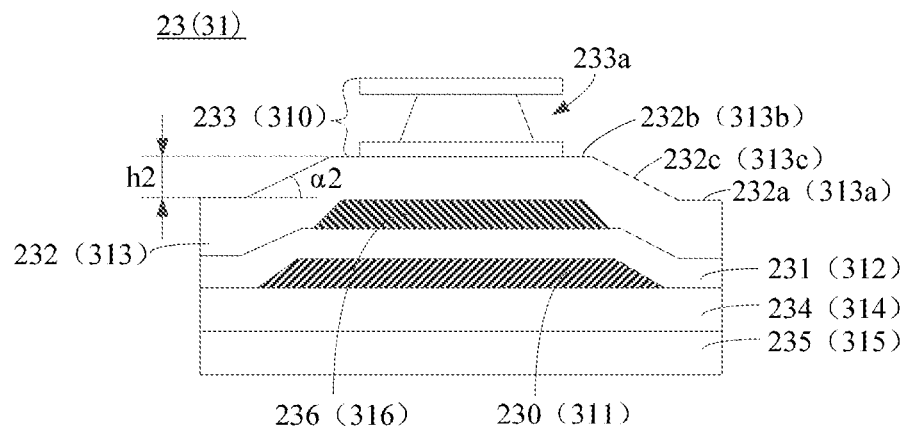
FIG. 11 is a schematic structural view of the first isolation column or the second isolation column of the display area in the display panel shown in FIG. 8.

The first metal layer 230 and the first electrode plate 250 or the second electrode plate 251 have the same material, for example, the first metal layer 230 is arranged on the same layer as the first electrode plate 250 or the second electrode plate 251. The first insulating layer 231 is arranged on the same layer as the first gate insulating layer 243. The second insulating layer 232 is arranged on the same layer as the interlayer dielectric layer 244, and the second insulating layer 232 includes a first portion 232a, a second portion 232b and a first inclined portion 232c connecting the first portion 232a and the second portion 232b. As shown in FIGS. 9 to 11, a slope angle α2 of the first inclined portion 232c is less than 90°. The second metal layer 233 is arranged on the same layer as the source and drain electrodes and is located at a side of the second portion 232b away from the base substrate 21, and a notch 233a surrounding the opening area 20b is arranged at a side facing towards the display area 20a and/or at a side facing towards the opening area 20b. The first inclined portion 232c is matched with the second metal layer 233 to block the organic light-emitting material, thus playing a role in isolating a passage for moisture and oxygen. It should be understood that, as shown in FIGS. 6 to 8, the first isolation column 23 can not only block the organic light-emitting material 301, but also block other materials, such as the cathode 302 or the like.

In an embodiment, an orthographic projection of the first portion 232a of the second insulating layer 232 on the base substrate 21 does not overlap with an orthographic projection of the first metal layer 230 on the base substrate 21. In an embodiment, an orthographic projection of the first inclined portion 232c of the second insulating layer 232 on the base substrate 21 may at least partially overlap with the orthographic projection of the first metal layer 230 on the base substrate 21. In an embodiment, an orthographic projection of the second portion 232b of the second insulating layer 232 on the base substrate 21 may be within the orthographic projection of the first metal layer 230 on the base substrate 21, or completely overlap with the orthographic projection of the first metal layer 230 on the base substrate 21.

In addition, an overlapping area of the orthographic projection of the second portion 232a of the second insulating layer 232 on the base substrate 21 and the orthographic projection of the first metal layer 230 on the base substrate 21 may be larger than an overlapping area of the orthographic projection of the first inclined portion 232c of the second insulating layer 232 on the base substrate 21 and the orthographic projection of the first metal layer 230 on the base substrate 21.

In addition, in an embodiment, when the first metal layer 230 and the first polar plate 250 have the same material, for example, they are arranged on the same layer, the first insulating layer 231 may also include a first portion, a second portion, and a first inclined portion connecting the first portion and the second portion. An orthographic projection of the first portion of the first insulating layer 231 on the base substrate 21 does not overlap with the orthographic projection of the first metal layer 230 on the base substrate 21. An orthographic projection of the second portion of the first insulating layer 231 on the base substrate 21 may at least partially or completely overlap with the orthographic projection of the first metal layer 230 on the base substrate 21, and preferably may be within the orthographic projection of the first metal layer 230 on the base substrate 21. The orthographic projection of the second portion 232b of the second insulating layer 232 on the base substrate 21 may be within the orthographic projection of the second portion of the first insulating layer 231 on the base substrate 21. An orthographic projection of the first inclined portion of the first insulating layer 231 on the base substrate 231 may at least partially overlap with the orthographic projection of the first metal layer 230 on the base substrate 21. Preferably, an overlapping area of the orthographic projection of the second portion of the first insulating layer 231 on the base substrate and the orthographic projection of the first metal layer 230 on the base substrate 21 may be larger than an overlapping area of the orthographic projection of the first inclined portion of the first insulating layer 231 on the base substrate and the orthographic projection of the first metal layer 230 on the base substrate 21.

In the embodiment of the present disclosure, the first metal layer 230, which has the same material as the first electrode plate 250 or the second electrode plate 251 (that is, arranged on the same layer as the first electrode plate 250 or the second electrode plate 251), is added at the bottom of the first isolation column 23, so that during the process of depositing the second insulating layer 232, an area opposite to the first metal layer 230 in the second insulating layer 232 is raised higher than other areas of the second insulating layer 232 to naturally form a slope angle α2 less than 90°. Since the second insulating layer 232 naturally forms the first inclined portion 232c at the slope angle α2, compared with the manufacturing process of the EBA/EBB isolation column 12 shown in FIGS. 1 to 3, the step of "exposing, developing, EBA (Etching Bending A)/EBB (Etching Bending B) etching the ILD+GI+buffer layer 120 to obtain a specific pattern" can be omitted in the process of manufacturing the first isolation column 23 according to the embodiment of the present disclosure, that is, one mask process can be omitted while blocking the organic light-emitting material, thereby reducing the cost.

In addition, according to the embodiment of the present disclosure, the first metal layer 230 is added so that a portion of the second insulating layer 232 opposite to the first metal layer 230 is raised, thereby forming the first inclined portion 232c at the slope angle α2. Therefore, compared with the slope angle α1 formed by exposing, developing and EBA (Etch Bending A)/EBB (Etch Bending B) etching the ILD+GI+buffer layer 120 shown in FIGS. 1 to 3, the slope angle α2 according to the embodiment of the present disclosure is smaller, and a segment difference h2 formed at the slope angle α2 is also smaller. Referring specifically to FIGS. 9 to 11, the slope angle α2 and the segment difference h2 according to the embodiment of the present disclosure are smaller than the slope angle α1 and the segment difference h1 in the EBA/EBB isolation column 12 shown in FIG. 3, respectively.

For example, the slope angle α2 of the first inclined portion 232c of the first isolation column 23 in the embodiment of the present disclosure may be 10° to 45°, such as 10°, 20°, 30°, 45°, or the like, and the slope angle α1 of the slope surface at the ILD+GI+buffer layer 120 of the EBA/EBB isolation column 12 shown in FIG. 3 may be 50° to 70°, such as 50°, 60°, 70°, or the like.

In this embodiment, the slope angle α2 of the first inclined portion 232c of the first isolation column 23 is smaller than the slope angle α1 at the slope of the EBA/EBB isolation column 12, so that when the inorganic packaging layer is deposited subsequently, the deposition of the inorganic packaging layer at the first inclined portion of the first isolation column 23 according to the embodiment of the present disclosure (e.g., the first inorganic packaging layer 232c shown in FIGS. 6 to 8) is more smooth than the deposition of the inorganic packaging layer 17 at the slope of the EBA/EBB isolation column 12 shown in FIGS. 1 and 2 so as to facilitate releasing the external stress, so that the inorganic packaging layer is not easy to crack under the external stress, and thus further prevent the intrusion of moisture and oxygen, and ensure the display effect.

It should be noted that the first insulating layer 231 and the second insulating layer 232 in the embodiment of the present disclosure may be formed as an integrated structure as long as the first inclined portion 232c can be formed.

In some embodiments, as shown in FIGS. 9 to 11, the first isolation column 23 further includes a third insulating layer 234 and a fourth insulating layer 235, the third insulating layer 234 may be arranged on the same layer as the second gate insulating layer 241, and the fourth insulating layer 235 may be arranged on the same layer as the buffer layer 22.

In some embodiments, as shown in FIGS. 6 and 9, the first metal layer 230 of the first isolation column 23 may be arranged on the same layer as the first electrode plate 250. Optionally, an orthographic projection of the second metal layer 233 in the first isolation column 23 on the base substrate 21 is within an orthographic projection of the first metal layer 230 on the base substrate 21, so that the inorganic packaging layer at the first isolation column 23 can facilitate releasing external stress and preventing the inorganic packaging layer from cracking under the external stress. It should be noted that the first metal layer 230 may also form a slope at a certain angle during the manufacturing process.

Further, within the same cross-sectional plane, a ratio of the cross-sectional width of the second metal layer 233 to the cross-sectional width of the first metal layer 230 is greater than or equal to 0.4 and less than or equal to 0.7. For example, the cross-sectional width of the first metal layer 230 may be 6.5 µm to 8.5 µm such as 6.5 µm, 7 µm, 7.5 µm, 8 µm, 8.5 µm, or the like; the cross-sectional width of the second metal layer 233 may be 3.5 µm to 4.5 µm such as 3.5 µm, 4 µm, 4.5 µm, or the like.

It should be noted that the segment difference h2 according to the embodiment of the present disclosure may be the thickness of the first metal layer 230. In addition, the cross-sectional plane mentioned in the embodiments of the present disclosure is a plane extending in the radial direction of the first isolation column 23; and the cross-sectional width may be the maximum width of the cross-section, which is not limited thereto, and the width of other positions of the cross-section may also be within the above-mentioned value ranges.

In some embodiments, as shown in FIGS. 7 and 10, the first metal layer 230 of the first isolation column 23 may be arranged on the same layer as the second electrode plate 251. Optionally, the orthographic projection of the second metal layer 233 in the first isolation column 23 on the base substrate 21 is within the orthographic projection of the first metal layer 230 on the base substrate 21, so that the inorganic packaging layer at the first isolation column 23 can facilitate releasing external stress and preventing the inorganic packaging layer from cracking under the external stress. It should be noted that the first metal layer 230 may also form a slope at a certain angle during the manufacturing process.

Further, within the same cross-sectional plane, a ratio of the cross-sectional width of the second metal layer 233 to the cross-sectional width of the first metal layer 230 is greater than or equal to 0.4 and less than or equal to 0.7. For example, the cross-sectional width of the first metal layer 230 may be 6.5 µm to 8.5 µm such as 6.5 µm, 7 µm, 7.5 µm, 8 µm, 8.5 µm, or the like; the cross-sectional width of the second metal layer 233 may be 3.5 µm to 4.5 µm such as 3.5 µm, 4 µm, 4.5 µm, or the like.

It should be noted that the segment difference h2 according to the embodiment of the present disclosure may be a thickness of the first metal layer 230. In addition, the cross-sectional plane mentioned in the embodiments of the present disclosure is a plane extending in the radial direction of the first isolation column 23; and the cross-sectional width may be the maximum width of the cross-section, which is not limited thereto, and the width at other positions of the cross-section may also be within the above-mentioned value ranges.

In some embodiments, as shown in FIGS. 8 and 11, the first metal layer 230 of the first isolation column 23 may have the same material as the first electrode plate 250 (for example, it may be arranged on the same layer as the first electrode plate 250), and the first isolation column 23 may further include a third metal layer 236 having the same material as the second electrode plate 251 (for example, arranged on the same layer as the second electrode plate 251). Optionally, the orthographic projection of the second metal layer 233 on the base substrate 21 is within the orthographic projection of the third metal layer 236 on the base substrate 21. The orthographic projection of the third metal layer 236 on the base substrate 21 is within the orthographic projection of the first metal layer 230 on the base substrate 21, so that the inorganic packaging layer at the first isolation post 23 can facilitate releasing the external stress and preventing the inorganic packaging layer from cracking under the external stress. It should be noted that the first metal layer 230 or the second metal layer 233 may also form a slope at a certain angle during the manufacturing process.

In an embodiment, the first portion 232*a* of the second insulating layer 232 does not overlap with an orthographic projection of the third metal layer 236 on the base substrate 21. The orthographic projection of the second portion 232*b* of the second insulating layer 232 on the base substrate 21 may at least partially or completely overlap with the orthographic projection of the third metal layer 236 on the base substrate 21, preferably within the orthographic projection of the third metal layer 236 on the base substrate 21. The orthographic projection of the first inclined portion 232*c* of the second insulating layer 232 on the base substrate 21 may at least partially overlap with the orthographic projection of the third metal layer 236 on the base substrate 21.

In addition, in the case where the first metal layer 230 and the third metal layer 236 are provided, the first insulating layer 231 may include a first portion, a second portion, and a first inclined portion connecting the first portion and the second portion. An orthographic projection of the first portion of the first insulating layer 231 on the base substrate 21 does not overlap with the orthographic projection of the first metal layer 230 on the base substrate 21, and an orthographic projection of the first inclined portion of the first insulating layer 231 on the base substrate 21 at least partially overlaps with the orthographic projection of the first metal layer 230 on the base substrate 21. An orthographic projection of the second portion of the first insulating layer 231 on the base substrate 21 may be within the orthographic projection of the first metal layer 230 on the base substrate 21.

Preferably, an overlapping area of the orthographic projection of the second portion of the first insulating layer 231 on the base substrate and the orthographic projection of the first metal layer 230 on the base substrate 21 may be larger than an overlapping area of the orthographic projection of the first inclined portion of the first insulating layer 231 on the base substrate 21 and the orthographic projection of the first metal layer 230 on the base substrate 21.

In addition, in an embodiment, the orthographic projection of the second metal layer 233 on the base substrate 21 may be within the orthographic projection of the second portion 232*b* of the second insulating layer 232 on the base substrate 21. The orthographic projection of the second portion 232*b* of the second insulating layer 232 on the base substrate 21 may be within the orthographic projection of the third metal layer 236 on the base substrate 21. The orthographic projection of the third metal layer 236 on the base substrate 21 may be within the orthographic projection of the second portion of the first insulating layer 231 on the base substrate 21. The orthographic projection of the second portion of the first insulating layer 231 on the base substrate 21 may be within the orthographic projection of the first metal layer 230 on the base substrate 21.

Further, within the same cross-sectional plane, the ratio of the cross-sectional width of the second metal layer 233 to the cross-sectional width of the first metal layer 230 is greater than or equal to 0.4 and less than or equal to 0.7; the ratio of the cross-sectional width of the second metal layer 233 to the cross-sectional width of the third metal layer 236 is greater than or equal to 0.5 and less than or equal to 0.9; the ratio of the cross-sectional width of the third metal layer 236 to the cross-sectional width of the first metal layer 230 is greater than or equal to 0.58 and less than 1. For example, the cross-sectional width of the first metal layer 230 may be 6.5 µm to 8.5 µm such as 6.5 µm, 7 µm, 7.5 µm, 8 µm, 8.5 µm, or the like; the cross-sectional width of the second metal layer 233 may be 3.5 µm to 4.5 µm such as 3.5 µm, 4 µm, 4.5 µm, or the like; the maximum width of the third metal layer 236 may be 5 µm to 7 µm such as 5 µm, 5.5 µm, 6 µm, 6.5 µm, 7 µm, or the like.

It should be noted that the segment difference h2 according to the embodiment of the present disclosure may be a sum of the thicknesses of the first metal layer 230 and the third metal layer 236. In addition, the cross-sectional plane mentioned in the embodiment of the present disclosure is a plane extending in the radial direction of the first isolation column 23; and the cross-sectional width may be the maximum width of the cross-section, which is not limited thereto, and the width of the other positions of the cross-section may also be within the above-mentioned value ranges.

It should be understood that the first metal layer 230, the second metal layer 233, and the third metal layer 236 in the first isolation column 23 mentioned in the previous embodiment are generally manufactured by the etching process, so that the manufactured first metal layer 230, second metal layer 233, and third metal layer 236 generally have a certain slope angle, specifically, an orthographic projection of a surface of the first metal layer 230, the second metal layer 233, or the third metal layer 236 away from the base substrate 21 on the base substrate 21 is on an orthographic projection of a surface thereof close to the base substrate 21 on the base substrate 21. Based on this, in order to ensure that the inorganic packaging layer can further release the external stress, in the embodiment of the present disclosure, the maximum cross-sectional width of the second metal layer 233 in the first isolation column 23 may be smaller than the minimum cross-sectional width of the first metal layer 230; the maximum cross-sectional width of the second metal layer 233 may be smaller than the minimum cross-sectional width of the third metal layer 236; the maximum width of the third metal layer 236 may be smaller than the minimum cross-sectional width of the first metal layer 230.

In addition, the first insulating layer 231, the second insulating layer 232, the third insulating layer 234, the fourth insulating layer 235 in the first isolation column 23 of the embodiment of the present disclosure are designed to have the same thickness as that of the GI1 layer, ILD layer, GI2 layer, buffer layer in the EBA/EBB isolation column of the related art, and when the maximum cross-sectional width and minimum cross-sectional width of the second insulating layer 232 with a slope angle α2 in the first isolation column 23 are designed to be the same as those of the ILD+GI+buffer layer 120 in the EBA/EBB isolation column, factors mainly affecting the slope angle α2 of the first isolation column 23 in the embodiment of the present disclosure are the thicknesses of the first metal layer 230 and the second metal layer 233. In order to make the slope angle α2 of the first isolation column 23 shown in FIGS. 9 to 11 according to the embodiment of the present disclosure smaller than the slope angle α1 of the EBA/EBB isolation column 12 shown in FIG. 3, the thickness of the first metal layer 230 or the third metal layer 236 may be 2000 Å to 3000 Å, such as 2200 Å, 2400 Å, 2600 Å, 2800 Å, 3000 Å, or the like. It should be understood that the thickness of the first metal layer 230 and the thickness of the third metal layer 236 may be identical or different, which can be determined depending on the specific situation.

The thickness of the second metal layer 233 in the first isolation column 23 may be 6000 Å to 8000 Å, such as 6000 Å, 6500 Å, 7000 Å, 7500 Å, 8000 Å, or the like. In order to enable the second metal layer 233 to better isolate and block the organic light-emitting material, a ratio of the thickness of the notch 233a on the second metal layer 233 to the thickness of the second metal layer 233 may be 0.5 to 0.8, for example, 0.5, 0.6, 0.7, 0.8, or the like.

It should be noted that when the second metal layer 233 is a Ti/Al/Ti multilayer structure, in order to manufacture the notch 233a, the Ti/Al/Ti multilayer structure may be etched by using a specific etching solution. The etching solution may only play an etching role on the Al layer, or an etching rate for the Al layer is higher than that for the Ti layer, so that the notch 233a may be formed on the second metal layer 233 and the second metal layer 233 has a barrier to form a film layer (for example, organic light-emitting material 301, cathode 302, or the like) by evaporation. It should be understood that the structure and material of the second metal layer 233 are not limited to the above, and can be determined depending on specific circumstances.

In an embodiment, the cross-sectional plane of the second metal layer 233 is "I-shaped", that is, the second metal layer 233 is provided with notches 233a surrounding the opening area 20b at a side thereof facing towards the display area 20a and at a side thereof facing towards the opening area 20b, so as to further isolate the organic light-emitting material 301, the cathode 302, and the like.

In addition, the thickness of the first insulating layer 231 may be 1000 Å to 1500 Å, such as 1000 Å, 1300 Å, 1500 Å, or the like. The thickness of the second insulating layer 232 may be 4000 Å to 6000 Å, such as 4000 Å, 5000 Å, 6000 Å, or the like. The thickness of the third insulating layer 234 may be 1000 Å to 1500 Å, such as 1000 Å, 1300 Å, 1500 Å, or the like. The thickness of the fourth insulating layer 235 may be 3000 Å to 5000 Å, such as 3000 Å, 4000 Å, 5000 Å, or the like.

It should be noted that the thickness of each of the structures arranged on the same layer mentioned in the embodiment of this disclosure may be identical or different.

In addition, it should be noted that the cross-sectional width mentioned in the embodiment of the present disclosure is a dimension in a X direction shown in FIGS. 6 to 8, and the thickness is a dimension in a Y direction shown in FIGS. 6 to 8.

Based on the above, the isolation column at a slope angle formed only by adding the metal layer arranged on the same layer as the first electrode plate 250 can be defined as a Gate1 isolation column; the isolation column at a slope angle formed only by adding the metal layer arranged on the same layer as the second electrode plate 251 can be defined as a Gate2 isolation column; the isolation column at a slope angle formed by adding the metal layer on the same layer as the first electrode plate 250 and the second electrode plate 251 can be defined as a Gate1+Gate2 isolation column. That is, the first isolation column 23 of the embodiment of the present disclosure may be the Gate1 isolation column, the Gate2 isolation column or the Gate1+Gate2 isolation column.

In some embodiments, as shown in FIGS. 5 to 8, the display panel 2 may further include a planarization layer 26 and a pixel defining layer 27, which are located in the display area 20a and a first barrier dam 28 and a second barrier dam 29, which are located in the isolation area 20c. The planarization layer 26 covers the thin film transistor 24, and the pixel defining layer 27 is formed on the planarization layer 26, that is, after the film layers of the thin film transistor 24 and the storage capacitor 25 are formed, the planarization layer 26 and the pixel defining layer 27 are sequentially formed. The pixel defining layer 27 is used to define a plurality of pixel units 30. The first barrier dam 28 and the second barrier dam 29 are both arranged around the opening area 20b, and the second barrier dam 29 is located at a side of the first barrier dam 28 close to the opening area 20b. The first barrier dam 28 and the pixel defining layer 27 are arranged on the same layer, and the second barrier dam 29 includes a first barrier portion 290 arranged on the same layer as the planarization layer 26 and a second barrier portion 291 arranged on the same layer as the pixel defining layer 27; and a height of the second barrier dam 29 is greater than a height of the first barrier dam 28. The first barrier dam 28 and the second barrier dam 29 are used to restrict the flow of material of the organic packaging layer 321 in the packaging thin film, to avoid packaging failure caused by the materials of the organic packaging layer 321 flowing into the opening area 20b.

It should be understood that in the embodiment of the present disclosure, the first barrier dam 28 or the second barrier dam 29 may also be separately provided, and the number of each of the first barrier dam 28 or the second barrier dam 29 may not be limited to one, but may be provided in plural. In addition, the structure of each of the first barrier dam 28 and the second barrier dam 29 may not be limited to the structure shown in FIGS. 6 to 8, and can be determined depending on specific circumstances.

The planarization layer 26 and the pixel defining layer 27 may be made of organic insulating materials, such as polyimide, epoxy resin, or the like. In addition, the display area may also include an inorganic protective layer (PVX) (not shown). The inorganic protective layer may be formed at a side of the source and drain electrodes away from the base substrate 21, and located at a side of the planarization layer 26 close to the base substrate 21. That is, the inorganic protective layer may be located between source and drain electrodes and the planarization layer, and the inorganic protective layer covers the source and drain electrodes to protect the source and drain electrodes. For example, the inorganic protective layer may be made of inorganic insulating materials such as silicon nitride, silicon oxide, and the like. It should be understood that the isolation region 20c is not provided with the inorganic protective layer to protect the isolation column.

In some embodiments, as shown in FIG. 5, the display panel 2 may further include a pixel unit 30 located in the display area 20a. The pixel unit may include an anode 300, an organic light-emitting material 301 and a cathode 302. The anode 300 may be formed on the planarization layer 26 prior to the pixel defining layer 27, and connected to the drain electrode 246 of the thin film transistor 24 through a via hole on the planarization layer 26. A pixel opening is formed on the pixel defining layer 27 corresponding to the anode 300, and exposes at least part of the anode 300. After the pixel defining layer 27 is formed, the organic light-emitting material 301 over the entire surface may be evaporated, and the organic light-emitting material 301 may be blocked at the first isolation column 23, as shown in FIGS. 6 to 8. The organic light-emitting material 301 is located in the pixel opening and is in contact with the anode 300. After the organic light-emitting material 301 over the entire surface is evaporated, the material of the cathode 302 over the entire surface may also be evaporated, and the material of the cathode 302 may also be blocked at the first isolation column 23, as shown in FIGS. 6 to 8.

It should be noted that the pixel unit 30 may also include functional layers such as an electron injection layer, an electron transport layer, a hole injection layer, and a hole transport layer, which are not shown. When these layers are formed in the display panel 2 by a vapor deposition, they may all be blocked at the first isolation column 23.

For example, the anode 300 may be made of indium tin oxide (ITO), indium zinc oxide (IZO), zinc oxide (ZnO) and other materials. The organic light-emitting material 301 may include a small molecule organic material or a polymer molecule organic material, and may be of a fluorescent light-emitting material or a phosphorescent light-emitting material, and may emit red light, green light, blue light, or white light or the like. The cathode 302 may be made of metal materials such as lithium (Li), aluminum (Al), magnesium (Mg), silver (Ag), or the like.

In some embodiments, as shown in FIGS. 6 to 8, the display panel 2 may further include a second isolation column 31 formed on the base substrate 21 and located in the isolation area 20c, and the second isolation column 31 is arranged around the opening area 20b. As shown in FIGS. 9 to 11, the second isolation column 31 at least includes a fourth metal layer 310. The fourth metal layer 310 has the same structure with the second metal layer 233 and is arranged on the same layer as the second metal layer 233. The first barrier dam 28 and the second barrier dam 29 are located between the first isolation column 23 and the second isolation column 31; that is, one of the first isolation column 23 and the second isolation column 31 is located at a side of the first barrier dam 28 close to the display area 20a, and the other of the first isolation column 23 and the second isolation column 31 is located at a side of the second barrier dam 29 close to the opening area 20b.

The isolation column at a side of the first barrier dam 28 close to the display area 20a can be defined as an inner isolation column, and the isolation column at a side of the second barrier dam 29 close to the opening area 20b can be defined as an outer isolation column, that is, one of the first isolation column 23 and the second isolation column 31 can be defined as an inner isolation column, and the other thereof can be defined as an outer isolation column.

FIGS. 6 to 8 only show that the first isolation column 23 is an inner isolation column and the second isolation column 31 is an outer isolation column, but the embodiment of the present disclosure is not limited thereto, and the first isolation column 23 may be an outer isolation column and the second isolation column 31 may be an inner isolation column.

In addition, the first isolation column 23 and/or the second isolation column 31 mentioned in the embodiment of the present disclosure may be provided in plural; that is to say, the inner isolation column or outer isolation column may be provided in plural. It should be noted that, as shown in FIGS. 6 to 8, the structures of a plurality of the inner isolation columns may be the same, which are not limited thereto, and may also be different; as shown in FIGS. 6 to 8, the structures of a plurality of the outer isolation columns may be the same, which are not limited thereto, and may also be different.

In the embodiment of the present disclosure, the organic light-emitting material 301 is further blocked by providing the inner isolation column and the outer isolation column, thereby further blocking the intrusion of moisture and oxygen and ensuring the display effect.

In some embodiments, the second isolation column 31 may be one of a Gate1 isolation column, a Gate2 isolation column, a Gate1+Gate2 isolation column or an EBA/EBB isolation column.

Specifically, as shown in FIGS. 6 and 9, the second isolation column 31 may be a Gate1 isolation column, and may include a fifth metal layer 311, a fifth insulating layer 312 and a sixth insulating layer 313 in addition to the fourth metal layer 310. The fifth metal layer 311 is arranged on the same layer as the first electrode plate 250. The fifth insulating layer 312 is arranged on the same layer as the first gate insulating layer 243. The sixth insulating layer 313 is arranged on the same layer as the interlayer dielectric layer 244. The sixth insulating layer 313 includes a third portion 313a, a fourth portion 313b, and a second inclined portion 313c connecting the third portion 313a and the fourth portion 313b. The slope angle of the second inclined portion 313c is the same as that of the first inclined portion 232c. The fourth metal layer 310 is located at a side of the fourth portion 313b away from the base substrate 21. Optionally, the second isolation column 31 may further include a seventh insulating layer 314 and an eighth insulating layer 315. The seventh insulating layer 314 is arranged on the same layer as the second gate insulating layer 241, and the eighth insulating layer 315 is arranged on the same layer as the buffer layer 22.

As shown in FIGS. 7 and 10, the second isolation column 31 may be a Gate2 isolation column, and may include a fifth metal layer 311, a fifth insulating layer 312 and a sixth insulating layer 313 in addition to the fourth metal layer 310. The fifth metal layer 311 is arranged on the same layer as the second electrode plate 251. The fifth insulating layer 312 is arranged on the same layer as the first gate insulating layer 243. The sixth insulating layer 313 is arranged on the same layer as the interlayer dielectric layer 244. The sixth insulating layer 313 includes a third portion 313a, a fourth portion 313b, and a second inclined portion 313c connecting the third portion 313a and the fourth portion 313b. The slope angle of the second inclined portion 313c is the same as that of the first inclined portion 232c, and the fourth metal layer 310 is located at a side of the fourth portion 313b away from the base substrate 21. Optionally, the second isolation column 31 may further include a seventh insulating layer 314 and an eighth insulating layer 315. The seventh insulating layer 314 is arranged on the same layer as the second gate insulating layer 241, and the eighth insulating layer 315 is arranged on the same layer as the buffer layer 22.

As shown in FIGS. 8 and 11, the second isolation column 31 may be a Gate1+Gate2 isolation column, and may include a fifth metal layer 311, a fifth insulating layer 312, a sixth metal layer 316 and a sixth insulating layer 313 in addition to the fourth metal layer 310. The fifth metal layer 311 is arranged on the same layer as the first electrode plate 250. The fifth insulating layer 312 is arranged on the same layer as the first gate insulating layer 243. The sixth metal layer 316 is arranged on the same layer as the second electrode plate 251. The sixth insulating layer 313 is arranged on the same layer as the interlayer dielectric layer 244. The sixth insulating layer 313 includes a third portion 313a, a fourth portion 313b, and a second inclined portion 313c connecting the third portion 313a and the fourth portion 313b. The slope angle of the second inclined portion 313c is the same as that of the first inclined portion 232c, and the fourth metal layer 310 is located at a side of the fourth portion 313b away from the base substrate 21. Optionally, the second isolation column 31 may further include a seventh insulating layer 314 and an eighth insulating layer 315. The seventh insulating layer 314 is arranged on the same layer as the second gate insulating layer 241, and the eighth insulating layer 315 is arranged on the same layer as the buffer layer 22.

The second isolation column 31 also includes an insulating lamination located on the fourth metal layer 310 close to the base substrate 21. The insulating lamination is arranged on the same layer as the buffer layer 22, the second gate insulating layer 241, the first gate insulating layer 243 and the interlayer dielectric layer 244, and is respectively disconnected with the buffer layer 22, the second gate insulating layer 241, the first gate insulating layer 243 and the interlayer dielectric layer 244. The insulating lamination has a slope surface at a slope angle of 50° to 70°. The second isolation column 31 may be an EBA/EBB isolation column shown in FIGS. 2 and 3.

In some embodiments, the first isolation column 23 is designed as at least one of a Gate1 isolation column, a Gate2 isolation column and a Gate1+Gate2 isolation column, and the second isolation column 31 is designed as at least one of a Gate1 isolation column, a Gate2 isolation column and a Gate1+Gate2 isolation column. This design can prevent cracks at the slope of the isolation column and prevent cracks at the edge of the opening area 20b from extending into the display area 20a, thereby further ensuring the packaging effect.

Based on the above, the structure of the second isolation column 31 may be identical to or different from that of the first isolation column 23, which can be determined depending on the specific situation. FIGS. 6 to 8 only show the case where the structures of the first isolation column 23 and the second isolation column 31 are the same; however, the embodiment of the present disclosure is not limited thereto.

In addition, when the first isolation column 23 is at least one of the Gate1 isolation column, the Gate2 isolation column and the Gate1+Gate2 isolation column, and the second isolation column 31 is at least one of the Gate1 isolation column, the Gate2 isolation column and the Gate1+Gate2 isolation column, the first insulating layer 231 and the fifth insulating layer 312 may be connected with the first gate insulating layer 243; the second insulating layer 232 and the sixth insulating layer 313 may be connected with the interlayer dielectric layer 244; the third insulating layer 234 and the seventh insulating layer 314 may be connected with the second gate insulating layer 241; and the fourth insulating layer 235 and the eighth insulating layer 315 may be connected with the buffer layer 22.

Specifically, a combination mode of the inner isolation column and the outer isolation column in the display panel 2 according to the embodiment of the present disclosure can be shown in TABLE 1 below.

TABLE 1

| SCHEME NUMBER | INNER ISOLATION COLUMN | OUTER ISOLATION COLUMN |
| --- | --- | --- |
| 1 | Gate1 isolation column | Gate1 isolation column |
| 2 | Gate1 isolation column | Gate2 isolation column |
| 3 | Gate1 isolation column | Gate + Gate2 isolation column |
| 4 | Gate2 isolation column | Gate1 isolation column |
| 5 | Gate2 isolation column | Gate2 isolation column |
| 6 | Gate2 isolation column | Gate1 + Gate2 isolation column |
| 7 | Gate1 + Gate2 isolation column | Gate1 isolation column |
| 8 | Gate1 + Gate2 isolation column | Gate2 isolation column |
| 9 | Gate1 + Gate2 isolation column | Gate1 + Gate2 isolation column |
| 10 | EBA/EBB isolation column | Gate1 isolation column |
| 11 | EBA/EBB isolation column | Gate2 isolation column |
| 12 | EBA/EBB isolation column | Gate1 + Gate2 isolation column |
| 13 | Gate1 isolation column | EBA/EBB isolation column |
| 14 | Gate2 isolation column | EBA/EBB isolation column |
| 15 | Gate1 + Gate2 isolation column | EBA/EBB isolation column |

It should be noted that the inner isolation column and the outer isolation column in the embodiment of this disclosure are not limited to the above-mentioned combined scheme design, for example, the inner isolation column may be provided in plural, and the structures thereof each is different, ect, as long as it can be ensured that there is at least one of the Gate1 isolation column, the Gate2 isolation column or the Gate1+Gate2 isolation column in the isolation area 20c of the display panel 2.

In some embodiments, as shown in FIGS. 6 to 8, the display panel 2 may further include a packaging thin film 32 which at least includes a first inorganic packaging layer 320 located in the display area 20a and the isolation area 20c and covers the driving circuit layer and the first isolation column 23. The first inorganic packaging layer 320 is smooth and not steep at the slope of the first isolation column 23, which is helpful to prevent cracks at the slope. It should be understood that the first inorganic packaging layer 320 may cover the structures of the entire display area 20a and the isolation area 20c to improve the packaging effect of the display panel 2.

Optionally, as shown in FIGS. 6 to 8, the packaging thin film 32 may further include a second inorganic packaging layer 322 and an organic packaging layer 321. The organic packaging layer 321 is located between the first inorganic packaging layer 320 and the second inorganic packaging layer 322. The organic packaging layer 321 may be located in the display area 20a and the isolation area 20c, and blocked at a side of the first barrier dam 28 close to the display area 20a. The second inorganic packaging layer 322 may cover the entire display area 20a and the isolation area 20c.

The first inorganic packaging layer 320 and the second inorganic packaging layer 322 are used to prevent water and oxygen from entering the display area 20a from the display side and the opening area 20b. The first inorganic packaging layer 320 and the second inorganic packaging layer 322 may be made of inorganic insulating materials such as silicon nitride, silicon oxide, or the like. The organic packaging layer 321 is used for planarization to facilitate for the manufacturing of the second inorganic packaging layer 322. The organic packaging layer 321 may be made of acrylic polymer, silicon polymer and other materials.

In addition, the first inorganic packaging layer 320 and the second inorganic packaging layer 322 may be made by a chemical vapor deposition, but are not limited thereto. The organic packaging layer 321 may be made by an inkjet printing process, but is not limited thereto, and may also be made by a spraying process. In the process of manufacturing the organic packaging layer 321, since the organic packaging material has certain fluidity, the first barrier dam 28 and the second barrier dam 29 may restrict the flow of the organic packaging material to avoid packaging failure caused by the organic packaging material flowing into the opening area 20b.

It should be noted that the opening area 20b in the display panel 2 according to the embodiment of the present disclosure is used to assemble devices such as cameras, sensors, HOME keys, earphones or speakers after opening treatment. It should be noted that for the display panel 2 according to the embodiment of the present disclosure, the opening area 20b of the display panel may not be subjected to the opening treatment, and the opening treatment may be performed before assembling the cameras and other devices. In addition, as shown in FIG. 4, the display panel 2 according to the embodiment of the present disclosure may have been subjected to the opening treatment in the opening area 20b, in this case, the display panel 2 may be directly used for subsequent assembling.

An embodiment of the present disclosure also provides a display device, which may include the display panel 2 described in the previous embodiments, and the opening area 20b of the display panel 2 may be subjected to the opening treatment, and the display device further includes functional devices such as cameras, sensors, HOME buttons, earpieces or speakers installed in the opening area 20b.

According to the embodiment of the present disclosure, the specific type of the display device is not particularly limited, and types of display devices commonly used in this field can be used, such as an AMOLED display screen, mobile devices such as mobile phones and notebook computers, wearable devices such as watches, VR devices, digital photo frames, navigators, and other products or components with display functions, and those skilled in the art can make corresponding choices according to the specific uses of the display device, which will not be described in detail herein.

It should be noted that the display device includes other necessary parts and components, for example the display, such as a housing, a power line, a driving chip, or the like, in addition to the display panel 2, and devices such as cameras, sensors, HOME buttons, earpieces or speakers. Those skilled in the art accordingly could make supplementations according to the specific use requirements of the display device, and will not be described in detail herein.

The embodiment of the present disclosure provides a manufacturing method of a display panel. The display panel 2 mentioned in the above embodiment may be manufactured by the manufacturing method, wherein the manufacturing method of the display panel includes: providing a base substrate; forming a driving circuit layer and a first isolation column on the base substrate; in which the driving circuit layer includes a thin film transistor and a storage capacitor located in the display area, the thin film transistor includes a gate electrode, a first gate insulating layer formed at a side of the gate electrode away from the base substrate, an interlayer dielectric layer formed at a side of the first gate insulating layer away from the base substrate, and source and drain electrodes formed at a side of the interlayer dielectric layer away from the base substrate; the storage capacitor includes a first electrode plate arranged on the same layer as the gate electrode and a second electrode plate located between the first gate insulating layer and the interlayer dielectric layer; the first isolation column is arranged around the opening area and includes a first metal layer, a first insulating layer formed at a side of the first metal layer away from the base substrate, a second insulating layer formed at a side of the first insulating layer away from the base substrate and a second metal layer formed at a side of the second insulating layer away from the base substrate; the first metal layer is arranged on the same layer as the first electrode plate or the second electrode plate; the first insulating layer is arranged on the same layer as the first gate insulating layer; the second insulating layer is arranged on the same layer as the interlayer dielectric layer, and includes a first portion, a second portion and a first inclined portion connecting the first portion and the second portion, a slope angle of the first inclined portion is less than 90°; the second metal layer is arranged on the same layer as the source and drain electrodes and is located at a side of the second portion away from the base substrate, and a notch surrounding the opening area is provided at a side facing towards the display area and/or at a side facing towards the opening area.

It should be understood that the above manufacturing method provided by the embodiment of this disclosure should have the same characteristics and advantages as the display panel 2 provided by the embodiment of this disclosure. Therefore, the characteristics and advantages of the above manufacturing method provided by the embodiment of this disclosure can refer to the characteristics and advantages of the display panel 2 described above, and will not be described in detail herein.

Hereafter, as an example of the display panel 2 shown in FIGS. 4 to 11, the manufacturing method of the display panel 2 provided by the embodiment of the present disclosure will be described in detail.

For example, a first inorganic insulating material layer may be formed on the base substrate 21 by deposition or other methods. The first inorganic insulating material may be formed over the entire surface of the base substrate 21, and may be divided into the buffer layer 22 in the display area 20a, the fourth insulating layer 235 of the first isolation column 23 and the eighth insulating layer 315 of the second isolation column 31 in the isolation area 20c.

After the first inorganic insulating material layer is formed, the semiconductor layer 240 of the thin film transistor 24 is formed in the display area 20a by a patterning process; and then, a second inorganic insulating material layer may be formed by deposition or other methods. The second inorganic insulating material layer may be entirely formed on the base substrate 21, and may be divided into the second gate insulating layer 241 in the display area 20a, and the third insulating layer 234 of the first isolation column 23 and the seventh insulating layer 314 of the second isolation column 31 in the isolation area 20c.

A metal thin film may be deposited on the second inorganic insulating material layer after the second inorganic insulating material layer is formed; and then, the metal thin film is processed by a patterning process to simultaneously form the gate electrode 242 of the thin film transistor 24 and the first electrode plate 250 of the storage capacitor 25 in the display area 20a, and the first metal layer 230 of the first isolation column 23 and the fifth metal layer 311 of the second isolation column 31 in the isolation area 20c. For example, the patterning process includes exposure, development and dry etching; and then, a third inorganic insulating material layer may be formed by the deposition or other methods. The third inorganic insulating material layer may be entirely formed on the base substrate 21, and may be divided into the first gate insulating layer 243 located in the display area 20a, and the first insulating layer 231 of the first isolation column 23 and the fifth insulating layer 312 of the second isolation column 31 located in the isolation area 20c.

A metal thin film is deposited on the third inorganic insulating material layer after the third inorganic insulating material layer is formed; the metal thin film is processed by a patterning process to simultaneously form the second electrode plate 251 of the storage capacitor 25 in the display area 20a and the third metal layer 236 of the first isolation column 23 and the sixth metal layer 316 of the second isolation column 31 in the isolation area 20c. For example, the patterning process includes exposure, development and dry etching, and then, a fourth inorganic insulating material layer may be formed by the deposition or other methods. The fourth inorganic insulating material layer be entirely formed on the base substrate 21, and may be divided into the interlayer dielectric layer 244 located in the display area 20a, and the second insulating layer 232 of the first isolation column 23 and the sixth insulating layer 313 of the second isolation column 31 located in the isolation area 20c.

After the fourth inorganic insulating material layer is formed, the interlayer dielectric layer 244 and the first gate insulating layer 243 are processed by a patterning process to expose via holes of the semiconductor layer 240. Thereafter, a source electrode 245 and a drain electrode 246 of the thin film transistor 24 in the display area 20a, and a second metal layer 233 of the first isolation column 23 and a fourth metal layer 310 of the second isolation column 31 in the isolation area 20c are simultaneously formed by using the patterning process. The source electrode 245 and the drain electrode 246 are respectively connected with both ends of the semiconductor layer 240 through the via holes on the interlayer dielectric layer 244 and the first gate insulating layer 243. For example, in one example, a titanium material layer, an aluminum material layer, and a titanium material layer may be sequentially formed by deposition, sputtering, evaporation, or the like, and then the three material layers are patterned by the same patterning process to form a titanium/aluminum/titanium three-layer metal structure constituting the source electrode 245 and the drain electrode 246, at the same time, an initial second metal layer 233 and an initial fourth metal layer 310 are formed with flush side surfaces. Then, the initial second metal layer 233 and the initial fourth metal layer 310 with flush side surfaces are etched through one single etching process to form the second metal layer 233 and the fourth metal layer 310 that each has a notch 233a on the side surface thereof.

After forming the thin film transistor 24 and the storage capacitor 25 in the display region 20a, and forming film layer structures of the first isolation column 23 and the second isolation column 31 in the isolation area 20c, the planarization layer 26 in the display region 20a and the first barrier portion of the second barrier dam 29 in the isolation area 20c may be simultaneously formed by a patterning process. Thereafter, the planarization layer 26 is processed by a patterning process to form a via hole exposing the drain electrode 246 of the thin film transistor 24. Then, an anode 300 of the pixel unit 30 is formed by a patterning process, and the anode 300 is connected with the drain electrode 246 of the thin film transistor 24 through the via hole on the planarization layer 26.

After forming the anode 300, a pixel defining layer 27 in the display area 20a and the second barrier portions of the first barrier dam 28 and the second barrier dam 29 in the isolation area 20c are simultaneously formed by a patterning process. The pixel defining layer 27 has a pixel opening exposing the anode 300. Thereafter, the organic light-emitting material 301 over the entire surface is evaporated to form an organic light-emitting material 301 located at the pixel opening and in contact with the anode 300. It should be understood that the organic light-emitting material 301 is blocked at the first isolation column 23 and the second isolation column 31.

After the organic light-emitting material 301 over the entire surface is evaporated, the material of the cathode 302 over the entire surface may also be evaporated to form the cathode 302 located in the display area 20a. The cathode 302 is in contact with the organic light-emitting material 301. It should be understood that the cathode 302 material is blocked at the first isolation column 23 and the second isolation column 31.

After the cathode 302 material over the entire surface is evaporated, the first inorganic packaging layer 320 of the packaging thin film 32 in the display area 20a and the isolation area 20c is deposited by a chemical vapor deposition. Thereafter, the organic packaging layer 321 of the packaging thin film 32 located in the display area 20a and the isolation area 20c is formed by an inkjet printing, and the organic packaging layer 321 is intercepted at the first barrier dam 28. Then, the second inorganic packaging layer 322 of the packaging thin film 32 located in the display area 20a and the isolation area 20c is deposited by the chemical vapor deposition. The first inorganic packaging layer 320 and the second inorganic packaging layer 322 cover the structures on the display area 20a and the isolation area 20c.

It should be noted that the manufacturing method of the display panel 2 in the embodiment of the present disclosure is not limited to the above, but can be adjusted according to the structure of the display panel 2 as required.

In addition, it should be noted that the specific structure of the display panel 2 manufactured in this manufacturing method can refer to the display panel 2 described in the previous embodiments, and the specific structure of the display panel 2 will not be described in detail herein.

It should be noted that after the display area 20a is formed, an opening area 20b may be formed by a laser cutting or a mechanical punching, and this opening area 20b penetrates through the base substrate 21. The devices such as a camera, a sensor, a HOME button, an earpiece, or a speaker may be assembled in opening area 20b.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

What is claimed is:

1. A display panel, comprising a display area, an opening area and an isolation area between the display area and the opening area, the isolation area being at least partially arranged around the opening area, and the display panel comprising: a base substrate; a driving circuit layer comprising a thin film transistor and a storage capacitor that are formed on the base substrate and located in the display area, in which the thin film transistor comprises a gate electrode, a first gate insulating layer formed at a side of the gate electrode away from the base substrate, an interlayer dielectric layer formed at a side of the first gate insulating layer away from the base substrate, and source and drain electrodes formed at a side of the interlayer dielectric layer away from the base substrate; the storage capacitor comprises a first electrode plate arranged on the same layer as the gate electrode, and a second electrode plate; a first isolation column formed on the base substrate and located in the isolation area; in which the first isolation column is arranged around the opening area and comprises a first metal layer, a first insulating layer formed at a side of the first metal layer away from the base substrate, a second insulating layer formed at a side of the first insulating layer away from the base substrate, and a second metal layer formed at a side of the second insulating layer away from the base substrate; the second insulating layer comprises a first portion, a second portion and a first inclined portion connecting the first portion and the second portion, wherein an orthographic projection of the first inclined portion on the base substrate at least partially overlaps with an orthographic projection of the first metal layer on the base substrate, and an orthographic projection of the second portion on the base substrate is within the orthographic projection of the first metal layer on the base substrate; the second metal layer is located at a side of the second portion away from the base substrate.

2. The display panel according to claim 1, wherein a notch surrounding the opening area is arranged at a side of the second metal layer facing towards the display area and/or a side of the second metal layer facing towards the opening area.

3. The display panel according to claim 1, wherein an overlapping area of the orthographic projection of the second portion of the second insulating layer on the base substrate and the orthographic projection of the first metal layer on the base substrate is larger than an overlapping area of the orthographic projection of the first inclined portion of the second insulating layer on the base substrate and the orthographic projection of the first metal layer on the base substrate.

4. The display panel according to claim 1, wherein the orthographic projection of the first portion of the second insulating layer on the base substrate does not overlap with the orthographic projection of the first metal layer on the base substrate.

5. The display panel according to claim 1, wherein a slope angle of the first inclined portion is less than 90°.

6. A display device, comprising the display panel according to claim 1.

7. The display panel according to claim 1, wherein
a buffer layer is further provided between the base substrate and the driving circuit layer;
the thin film transistor further comprises a semiconductor layer and a second gate insulating layer sequentially formed on the buffer layer, and the second gate insulating layer is between the gate electrode and the semiconductor layer.

8. The display panel according to claim 7, wherein
the first isolation column further comprises a third insulating layer and a fourth insulating layer, the third insulating layer is arranged on the same layer as the second gate insulating layer, and the fourth insulating layer is arranged on the same layer as the buffer layer.

9. The display panel according to claim 8, wherein the display panel further comprises:
a planarization layer located in the display area and covering the thin film transistor;
a pixel defining layer located in the display area and formed on the planarization layer for defining a plurality of pixel units;
a first barrier dam arranged around the opening area, the first barrier dam being arranged on the same layer as the pixel defining layer;
a second barrier dam arranged around the opening area; in which the second barrier dam is located at a side of the first barrier dam close to the opening area, and comprises a first barrier portion arranged on the same layer as the planarization layer and a second barrier portion arranged on the same layer as the pixel defining layer; a height of the second barrier dam is greater than that of the first barrier dam.

10. The display panel according to claim 9, wherein the display panel further comprises a second isolation column formed on the base substrate and located in the isolation area, the second isolation column is arranged around the opening area, and the second isolation column at least comprises a fourth metal layer that has the same structure with the second metal layer and is arranged on the same layer as the second metal layer;
wherein the first barrier dam and the second barrier dam are positioned between the first isolation column and the second isolation column.

11. The display panel according to claim 10, wherein the second isolation column further comprises a fifth metal layer, a fifth insulating layer and a sixth insulating layer, the fifth metal layer is arranged on the same layer as the first electrode plate or the second electrode plate; the fifth insulating layer is arranged on the same layer as the first gate insulating layer; the sixth insulating layer is arranged on the same layer as the interlayer dielectric layer;
wherein the sixth insulating layer comprises a third portion, a fourth portion and a second inclined portion connecting the third portion and the fourth portion, a slope angle of the second inclined portion is the same as that of the first inclined portion, and the fourth metal layer is located at a side of the fourth portion away from the base substrate.

12. The display panel according to claim 11, wherein the fifth metal layer is arranged on the same layer as the first electrode plate;
the second isolation column further comprises a sixth metal layer that is arranged on the same layer as the second electrode plate.

13. The display panel according to claim 1, wherein an orthographic projection of the second metal layer on the base substrate is within an orthographic projection of the first metal layer on the base substrate.

14. The display panel according to claim 13, wherein the first metal layer has the same material as the first electrode plate;
the first isolation column further comprises a third metal layer having the same material as the second electrode plate.

15. The display panel according to claim 14, wherein the first insulating layer comprises a first portion, a second portion and a first inclined portion connecting the first portion and the second portion, and
wherein an orthographic projection of the first portion of the first insulating layer on the base substrate does not overlap with the orthographic projection of the first metal layer on the base substrate, and an orthographic projection of the first inclined portion of the first insulating layer on the base substrate at least partially overlaps with the orthographic projection of the first metal layer on the base substrate.

16. The display panel according to claim 15, wherein an overlapping area of the orthographic projection of the second portion of the first insulating layer on the base substrate and the orthographic projection of the first metal layer on the base substrate is larger than an overlapping area of the orthographic projection of the first inclined portion of the first insulating layer on the base substrate and the orthographic projection of the first metal layer on the base substrate.

17. The display panel according to claim 14, wherein the orthographic projection of the second metal layer on the base substrate is within an orthographic projection of the third metal layer on the base substrate;
the orthographic projection of the third metal layer on the base substrate is within the orthographic projection of the first metal layer on the base substrate.

18. The display panel according to claim 17, wherein the orthographic projection of the second portion of the second insulating layer on the base substrate is within the orthographic projection of the third metal layer on the base substrate, and the orthographic projection of the first inclined portion of the second insulating layer on the base substrate at least partially overlaps with the orthographic projection of the third metal layer on the base substrate.

19. The display panel according to claim 17, wherein
in the same cross-sectional plane, a ratio of a cross-sectional width of the second metal layer to a cross-sectional width of the first metal layer is greater than or equal to 0.4 and less than or equal to 0.7;
in the same cross-sectional plane, a ratio of the cross-sectional width of the second metal layer to a cross-sectional width of the third metal layer is greater than or equal to 0.5 and less than or equal to 0.9;
in the same cross-sectional plane, a ratio of the cross-sectional width of the third metal layer to the cross-sectional width of the first metal layer is greater than or equal to 0.58 and less than 1;
wherein the cross-sectional plane is a plane extending in a radial direction of the first isolation column.

20. The display panel according to claim 19, wherein
the cross-sectional width of the first metal layer is 6.5 μm to 8.5 μm;
the cross-sectional width of the second metal layer is 3.5 μm to 4.5 μm;
the cross-sectional width of the third metal layer is 5 μm to 7 μm.

\* \* \* \* \*